United States Patent [19]

MacDonald et al.

[11] Patent Number: 5,628,917

[45] Date of Patent: May 13, 1997

[54] MASKING PROCESS FOR FABRICATING ULTRA-HIGH ASPECT RATIO, WAFER-FREE MICRO-OPTO-ELECTROMECHANICAL STRUCTURES

[75] Inventors: Noel C. MacDonald; Ali Jazairy, both of Ithaca, N.Y.

[73] Assignee: Cornell Research Foundation, Inc., Ithaca, N.Y.

[21] Appl. No.: 383,524

[22] Filed: Feb. 3, 1995

[51] Int. Cl.$^6$ .............................. B44C 1/22; H01L 21/00
[52] U.S. Cl. ........................ 216/2; 216/41; 216/67; 216/79; 438/702; 438/911; 438/50
[58] Field of Search ................ 156/643.1, 631.1, 156/651.1, 653.1, 657.1, 659.11, 661.11, 662.1; 216/2, 11, 67, 79, 36, 41; 437/186, 203, 228 PE, 228 S, 233

[56] References Cited

U.S. PATENT DOCUMENTS

| | | | |
|---|---|---|---|
| 4,676,863 | 6/1987 | Furuyama et al. | 156/661.11 X |
| 4,845,048 | 7/1989 | Tamaki et al. | 156/662.1 X |
| 5,198,390 | 3/1993 | MacDonald et al. | 437/203 |
| 5,316,979 | 5/1994 | MacDonald et al. | 437/203 |
| 5,393,375 | 2/1995 | MacDonald et al. | 156/643 |

OTHER PUBLICATIONS

S.R. Mallinson and J.H. Jerman, "Miniature micromachined Fabry–Perot interferometers in silicon," Electronics letters, vol. 23, No. 20, pp. 1041–1043, Sep. 24, 1987.

J.H. Jerman, D.J. Clift and S.R. Mallinson, "A miniature Fabry Perot interferometer with a corrugated silicon diaphragm support" Sensors and Actuators, vol. A29, pp. 151–158, 1991.

J.H. Jerman and D.J. Clift, "Miniature Fabry–Perot interferometers micromachined in silicon for use in optical fiber WDM systems," Transducers '91, Proceedings of the 1991 international conference on solid–state sensors and actuators, pp. 372–375, IEEE, New York 1991.

*Primary Examiner*—William Powell
*Attorney, Agent, or Firm*—Jones, Tullar & Cooper, P.C.

[57] ABSTRACT

A masking process resulting from a modified version of the SCREAM process is used for the fabrication of ultra-high aspect ratio, wafer-free, single crystal silicon movable micromechanical devices and frame structures of large vertical depth and narrow linewidth. The process is single-mask, self-aligned and allows the formation of releasable three-dimensional frame-like objects of arbitrary shape which can be made up to about half the wafer thickness in depth and can be subsequently lifted off the substrate and placed on any other material to be used as a mask or to be integrated with other devices. The process consists of a single lithography step and a repeated sequence of thermal oxidations and reactive ion etchings.

17 Claims, 10 Drawing Sheets

MASKING PROCESS FOR FABRICATING ULTRA-HIGH ASPECT RATIO, WAFER-FREE MICRO-OPTO-ELECTROMECHANICAL STRUCTURES

This invention was made with Government support awarded by the National Science Foundation, ARPA and the Optoelectronics Technology Center. The Government has certain rights in the invention.

BACKGROUND OF THE INVENTION

The present invention relates, in general, to a novel masking process. The process is similar to the single crystal reactive etch and metallization (SCREAM) process described in U.S. Pat. No. 5,198,390, although the present inventive process includes additional novel steps resulting in a powerful process useful in the fabrication of ultra-high aspect ratio, wafer-free, single crystal silicon, movable micromechanical devices and frame structures of large vertical depth and narrow linewidth.

The SCREAM process generates a method to integrate metal electrodes for capacitor actuators and thin film insulators for electrical isolation. This process is adapted to make operational micro-electromechanical as well as micro-opto-electromechanical mechanisms. The SCREAM process includes selective oxidation of narrow beam segments, formation of silicon-on-insulator structures for electrical isolation, and metal contact incorporation on the suspended silicon beams. Sputtered metal is selectively etched from all the mirrors or optical components of the device. A final isotropic etch selectively releases the moving structures and the oxide isolating segments mechanically connect, but electrically isolate the silicon beams.

The present invention shows Single Crystal Silicon (SCS) to be an excellent base from which to build high-aspect-ratio micromechanisms. SCS exhibits low defect density, low internal friction, and high fatigue strength. However, it is difficult to develop high aspect ratio SCS processes that allow formation of complex geometry, freely suspended, submicron structures. The etch rate of wet chemical etching is usually highly dependent on crystal orientation, consequently larger SCS structures are more easily fabricated if the minimum feature size and feature spacing are compatible with tolerances of the etch-dependent irregular surfaces. Such large (>10 µm) chemically etched structures have been utilized to make accelerometers and pressure sensors. SCS is also highly transparent in the near infrared (IR) region for wavelengths greater than about 1 µm, which makes it ideal for micro-opto-electromechanical device applications. Also, the etch masks used in SCS processing such as $SiO_2$ and $Si_3N_4$ can be used as thin-film optical coatings since they also exhibit very low energy absorption in the near infrared region.

Recent trends in the field of micromechanics are leading to larger surface to volume ratio SCS structures for the generation of large forces and displacements. Thus, high aspect ratio capacitor drives of large vertical depth to lateral width are needed for the actuation of such devices. A popular but expensive way to achieve the fabrication of deep structures is to use the LIGA technique (in German: *Lithographie, Galvanoformung, Abformung*). This process uses X-ray lithography, electroforming and molding of plastics, ceramics, metals and metal alloys and generates microstructures with structural heights of several 100 µm and lateral dimensions of a few micrometers with an accuracy in the submicrometer range. Synchrotron radiation offers the advantage of high energy density and excellent parallelism at short wavelengths (0.2 to 0.5 nm). However, this LIGA process is not accessible to most research groups and industries because of its high cost. Other complex methods include using cryogenic dry etching at very low temperatures (−120° C.) for maximum etch rate of silicon, or electroplating of high aspect ratio resist profiles.

Up until recently, SCS bulk micromachining did not offer such deep trench etching capabilities, and even in the extreme cases, maximum depths of no more than about 30 µm have been achieved, the limitation being the practical thickness of the etch mask (whose profile is directly transferred into the etched substrate). During a deep trench etch, the selectivity (measure of the preferential etch rate of the substrate relative to that of the mask), is not high enough and the mask erodes away. Its thickness is limited by the practical amount of masking material that can be deposited, something less than 5 µm.

Therefore, deep, vertical and smooth etch masks are highly desirable to produce high aspect ratio structures. Large surface to volume structures also imply narrow linewidth devices and there is a need for making beam widths from 2 µm down to a ⅒ µm.

The integration of microelectromechanical systems (MEMS) with optical devices resulting in micro-opto-electromechanical systems (MOEMS) offers many new possibilities in the fields of micromechanics and micro-optics.

For example, a key component of Wavelength Division Multiplexed (WDM) networks is a tunable broadband wavelength demultiplexer with good selectivity. The function of a wavelength division demultiplexer is to spatially separate n channels according to wavelength. This selection may be done in parallel (n channels directed to n detectors simultaneously), or serially (one of n channels directed to a single detector). In general, parallel elements utilize multiple fiber devices, while serial elements utilize tunable devices. The Fabry-Pérot interferometer provides sharp, low-loss and narrow linewidth optical transmission peaks capable of being tuned to select a particular wavelength channel from a light source such as a distributed feedback (DFB) laser while providing isolation to all other operating channels. These characteristics offer powerful communications applications to optical fiber WDM system technology.

Tunable laser sources can also be generated by using microelectromechanically modulated Fabry-Pérot interferometers as laser intra-cavity elements (e.g. movable mirrors for a doubly-resonant optical parametric oscillator OPO (DRO)), or as filter elements. A tunable ring laser setup, including a semiconductor amplifier, an optical isolator and a polarization controller, has been described for such a filter application.

In-the-plane, micromachined Fabry-Perot interferometers have already been investigated by other research groups. The device fabrication consisted of bonding two silicon wafers together, one with movable central elements, and including a thin etch-stopped corrugated diaphragm as the suspension. The present invention results in the fabrication of an out-of-plane SCS Fabry-Perot interferometer. Using the SCREAM process alone, this device appears to be the first device of its kind using only one SCS wafer. The process produces self-aligned, released, movable vertical mirror elements. The modified version of this process, which is the subject of the present invention, can produce high-aspect ratio, vertical and smooth mirror sidewalls.

Microelectromechanical devices using comb drives such as accelerometers can be considered as a repeated sequence of three-mirror Fabry-Pérot interferometers, and each of the three-mirror unit comprises in itself two interferometers in series with different gaps. The effective free spectral range (FSR) of such a three-mirror system would increase by about an order of magnitude compared to a two-mirror unit. Devices with comb drive geometries can be visualized as higher performance but more complex FPI's. In this manner, they could constitute sensitive displacement or acceleration sensors.

Light modulators are usually based on changes of the refractive index of the material due to electro-optics, acousto-optics or magneto-optics. With a micromechanical device, the width of the optical resonance cavity can be modulated electrostatically, thus changing the spectral reflectivity or transmissivity of the incident light. The Fabry-Pérot interferometer can be considered as the archetype of the optical resonator. This optical element consists of two partially reflecting, low loss, parallel mirrors separated by a gap. The optical transmission characteristic through these mirrors consists of a series of sharp peaks with narrow bandwidth (BW) when the gap distance equals a half wavelength multiple of the incident light. The transmission intensity depends on both the gap distance and the wavelength. So, by varying the gap distance and monitoring the intensity, the device can be used as a wavelength tuner, within the free spectral range (FSR) of the device. Otherwise, by maintaining the incident wavelength fixed, the device can be used as a very sensitive displacement, acceleration or pressure sensor. An important feature of the FPI is that the FSR and the BW can be independently controlled. For a given wavelength, the cavity gap sets the FSR and the mirror reflectivity controls the bandwidth. Excellent wavelength tuning is contingent upon a high cavity finesse (the finesse of an interferometer can be associated with the quality factor Q of a classical oscillator).

SUMMARY OF THE INVENTION

It is, therefore, a purpose of the present invention to provide high aspect ratio, wafer-free, single crystal silicon, micro-opto-electromechanical structures using a novel fabrication process.

It is another object of the invention to fabricate high aspect ratio structures with deep sidewalls exceeding 100 μm in vertical dimension.

A still further object of the invention to fabricate a narrow linewidth structure with less than 200 nm in lateral width.

A still further object of the present invention is to provide a process to produce entirely released, wafer-free structures containing movable, high aspect ratio devices of large vertical depth (>100 μm) to lateral width.

Briefly, the present invention is directed to a new technology resulting from a modified and powerful version of the previously mentioned SCREAM process. The present invention process allows the fabrication of ultra-high aspect ratio, wafer-free, single crystal silicon movable micromechanical devices and frame structures of large vertical depth and narrow linewidth. The process requires a single lithography step, is self-aligned and allows the formation of releasable three-dimensional frame-like objects of arbitrary shape which can be made up to about half the wafer thickness in depth (with an aspect ratio exceeding 100:1). These objects can be subsequently lifted off the substrate and placed on any other material to be used as a mask or to be integrated with other devices. The process consists of a single lithography step and a repeated sequence of thermal oxidations and reactive ion etchings (RIE) which can be repeated for even deeper features.

In general, the process uses a single lithography step to define the entire structure. In one embodiment of the invention, the starting substrate is a highly doped single crystal silicon wafer. The substrate is then annealed in a high temperature furnace. A 2 μm layer of wet silicon dioxide is thermally grown on the wafer, onto which is deposited an additional 3 μm of low temperature, low pressure chemical vapor deposited (LPCVD) silicon dioxide. This material can be first patterned lithographically, then etched by a magnetron ion etching (MIE) process to produce the first etch mask for trench RIE #1. After the first RIE, a partial thermal silicon dioxide layer is grown to produce narrow linewidth beams in accordance with the desired small lateral dimensions. Following this step, the wafer is dipped in hydrofluoric acid (HF). Thereafter, another silicon dioxide layer is grown to oxidize through all the structural beams of the device. The floor silicon dioxide is removed during another MIE process, thus forming a second, thick etch mask for a subsequent trench RIE #2. It is this relatively thick mask which allows a second RIE step to form deep sidewalls in accordance with the desired vertical dimensions. Then, another thermal silicon dioxide layer is grown to provide isolation and a top/sidewall etch mask. Finally, the floor silicon dioxide is removed and the entire structure can be released off the wafer.

Using this process, we have fabricated a prototype out-of-the-plane Fabry-Pŕot interferometer "on-a-frame". The optical device is mounted on a frame, which includes suspended contact pads and oxide isolating segments. During the process, the total structure (with 8.6 mm² surface area) is fixed to the substrate through serpentine springs. Using a pair of fine tweezers, these springs are clipped and the thin membrane-like structure is lifted off the substrate to be placed exactly, for example, between self-aligned input and output single-mode optical fibers. Because of the tendency of clean surfaces to stick together, the displaced frame can be fixed onto another substrate by using several techniques (such as thermal annealing at high temperatures). The suspended FPI "on-a-frame" is made from freely released beams of dimensions comparable to fiber diameter with a vertical depth of 107.5 μm. The mirrors of the FPI, which consist of a series of λ/4 $SiO_2$ and Si film stacks separated by an initial gap distance of 10 μm, attract each other when a bias is applied across these capacitor-type plates and can tune broad-band IR light into a specific wavelength.

BRIEF DESCRIPTION OF THE DRAWINGS

The foregoing and additional objects, features and advantages of the present invention will become apparent to those of skill in the art from the following more detailed description of the invention taken in conjunction with the accompanying drawings, in which.

DESCRIPTION OF THE PREFERRED EMBODIMENTS

In accordance with the present invention a powerful masking process is used to fabricate ultra-high aspect ratio, wafer-free, single crystal silicon movable micromechanical devices and frame structures of large vertical depth and narrow linewidth. The process requires a single lithography step, is self-aligned and allows the formation of releasable three-dimensional frame-like objects of arbitrary shape which can be made up to about half the wafer thickness in depth (with an aspect ratio exceeding 100:1). These objects can be subsequently lifted off the substrate and placed on any other material to be used as a mask or to be integrated with other devices. The process steps of the invention are diagrammatically illustrated in the accompanying drawings 1a–1n referred to in the following text.

Referring, generally, to FIG.'S 1a–1n, the starting substrate includes, in a preferred embodiment, a boron doped, 4 ohm-cm, p-type (100) silicon wafer 10. A layer of p$^+$ type heavily doped silicon is formed by implanting boron (B) to a dose of 5 10$^{15}$ cm$^{-2}$ at 60 kV. This provides for subsequent Schottky diode (metal/semiconductor) contact, if desired. The substrate 10 is then annealed in a high temperature furnace at 900 C in dry oxygen and nitrogen. The dry oxygen anneal step is optional if it is followed by a wet thermal oxidation. A uniform 2 μm layer of wet silicon dioxide 12 ($O_2/H_2$ precursors) is thermally grown at 1100 C on the wafer. An additional 3 μm masking layer of low temperature LPCVD silicon dioxide 14 ($SiO_2/O_2$ precursors) is deposited at 400 C, the previously formed layer 12 helping to prevent cracking. The resulting thick, initial masking layer ultimately allows a deep reactive ion etch (RIE). A first etch mask is formed by lithographically patterning a vertical and smooth resist layer 16 on the masking layer 14 using a suitable contrast enhancing material capable of producing nanometer-scale feature sizes.

Figure 1A:
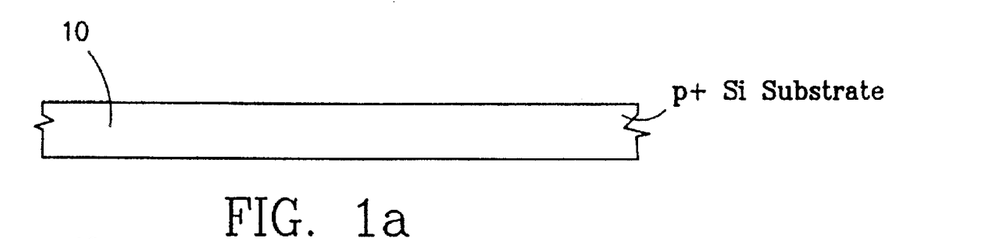
FIGS. 1a–1n illustrate in diagrammatic form a masking process for the fabrication of submicron, single-crystal released structures.
Figure 1B:
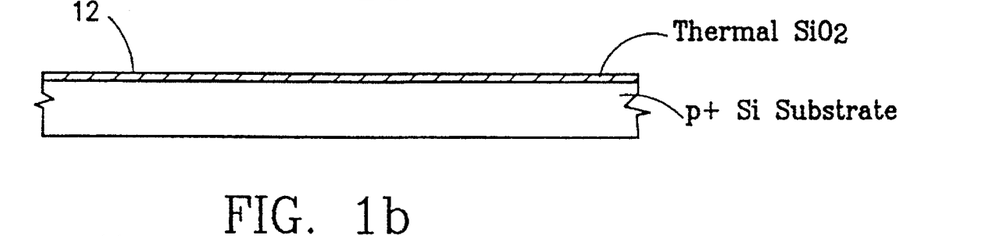
Figure 1C:
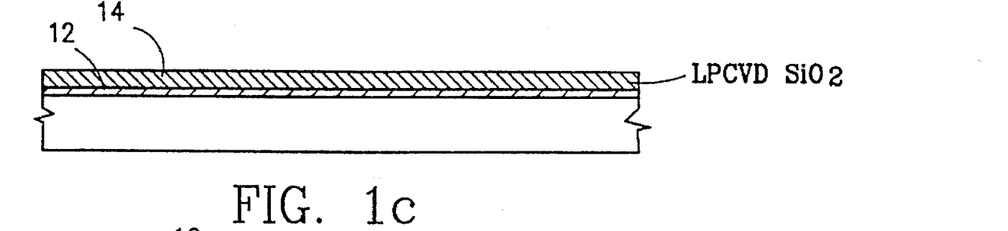
Figure 1D:
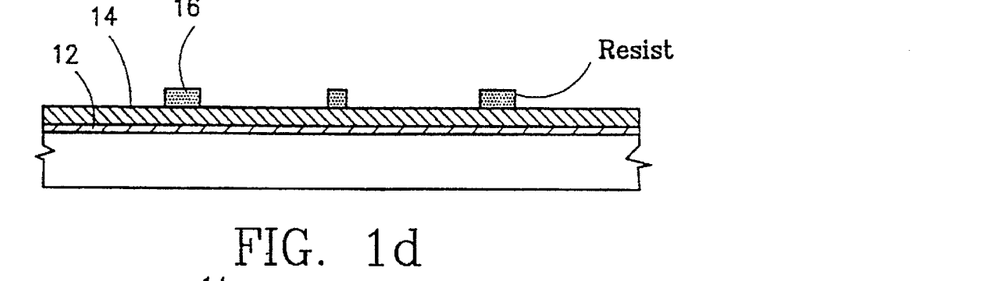
Figure 1E:
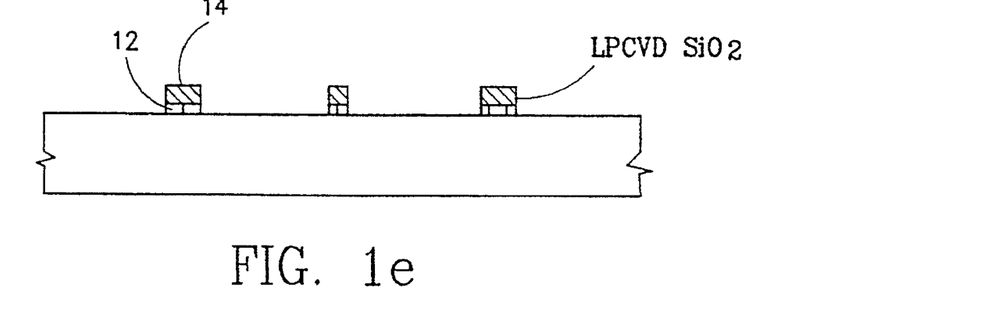
Figure 1F:
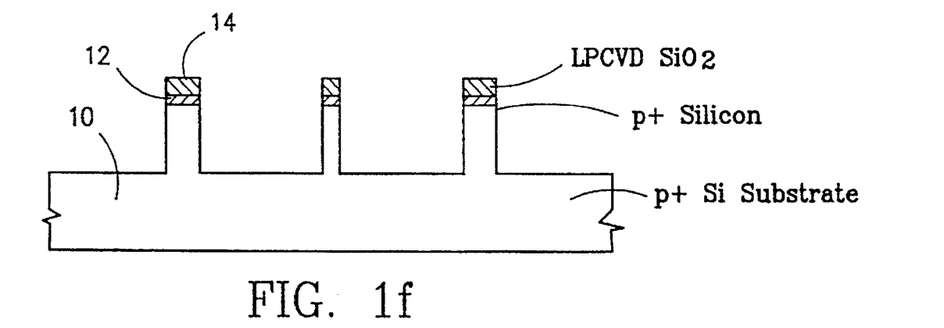
Figure 1G:
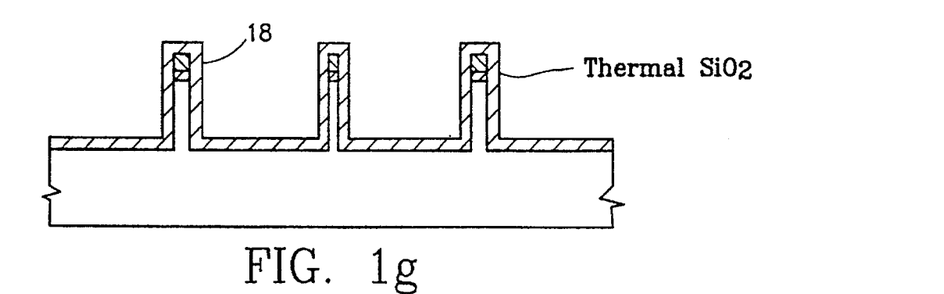
Figure 1H:
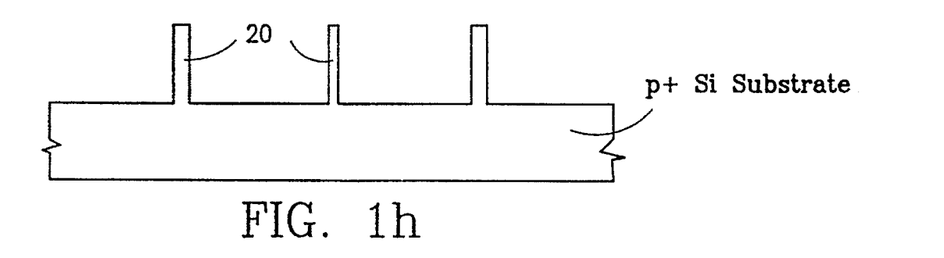
Figure 1I:
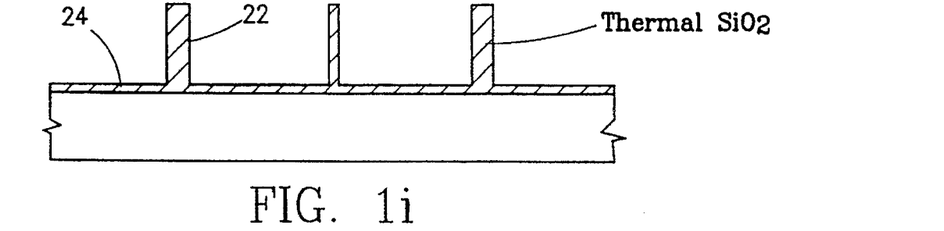
Figure 1J:
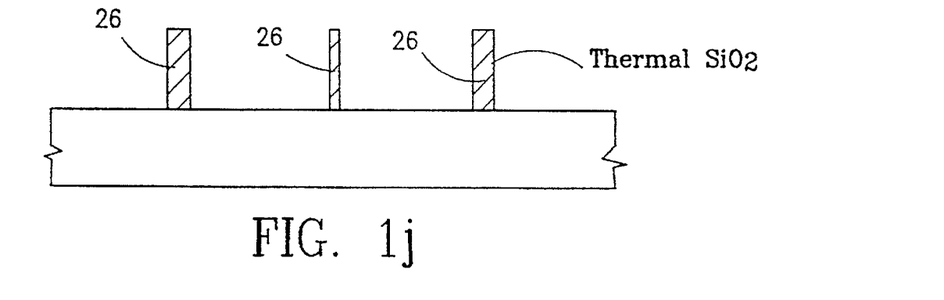

The photoresist is then transferred to the underlying $SiO_2$ masking layer 14 by magnetron-enhanced reactive ion etching (MERIE or MIE) in $CHF_3$ plasma. This etch has a high selectivity to $SiO_2$ and produces a nearly vertical etch mask for a trench RIE. After stripping the resist, resulting in the structure depicted in FIG. 1e, the pattern in the $SiO_2$ is transferred to the silicon substrate 10 via the first trench RIE using a $Cl_2/BC_3$ plasma resulting in an etch depth of 20–30 μm, FIG. 1f. A partial thermal silicon dioxide ($O_2/N_2/H_2$ precursors) layer 18 is then grown onto said exposed substrate, as shown in FIG. 1g. Following this step, the wafer is dipped in 6:1 buffered hydrofluoric acid HF:$H_2O$ solution to remove all prevous formed layers, thus yielding narrow linewidth (<200 nm) beams 20 having a desired small layer dimension, as illustrated in FIG. 1h. Thereafter, another thermal silicon dioxide ($O_2/H_2$ precursors) layer 22 is grown to completely oxidize the structural beams of the device, the oxidation occurring both vertically and horizontally, throughout the beams, as depicted in FIG. 1i. The floor silicon dioxide 24 is removed using another MIE process. Referring to FIG. 1j, removal of the floor silicon dioxide leaves oxidized beams 26 which then serve as a 20–30 μm-thick second etch mask for a subsequent trench RIE step. It can be seen that a lateral oxidation of 2 μm results in a 20–30 μm tall mask. It has previously been practically impossible to deposit a mask of this thickness on a wafer.

Figure 1K:
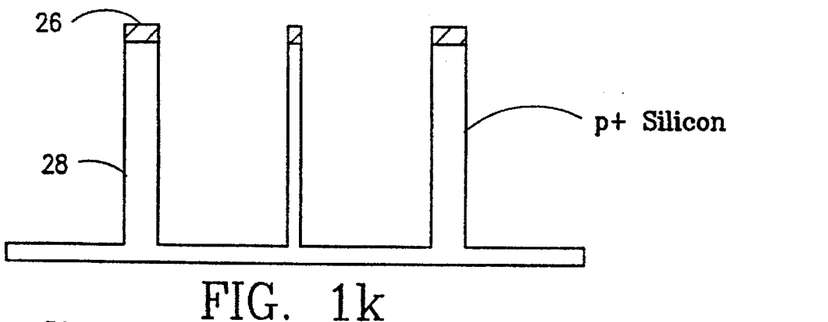
Figure 1L:
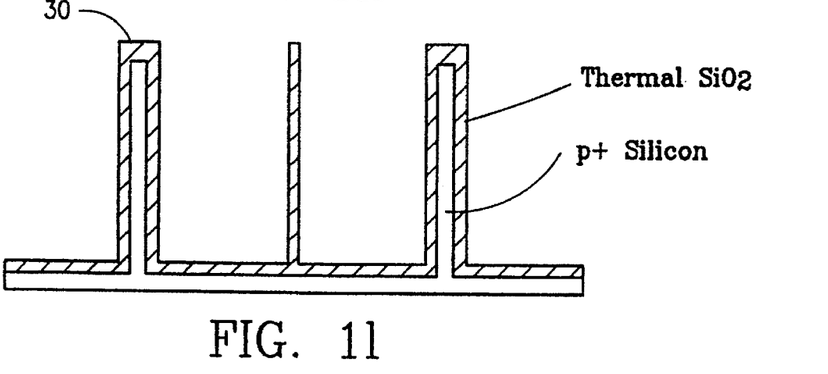
Figure 1M:
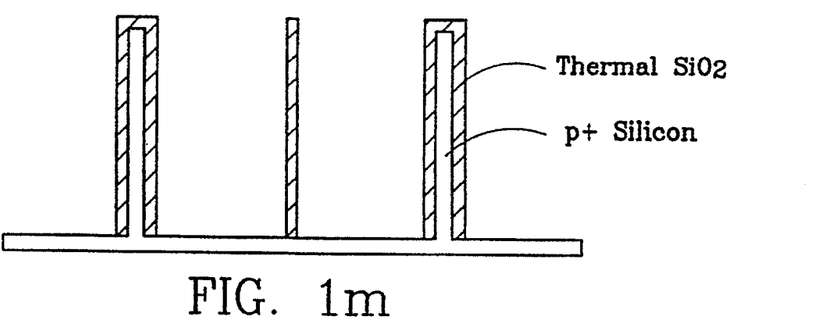
Figure 1N:
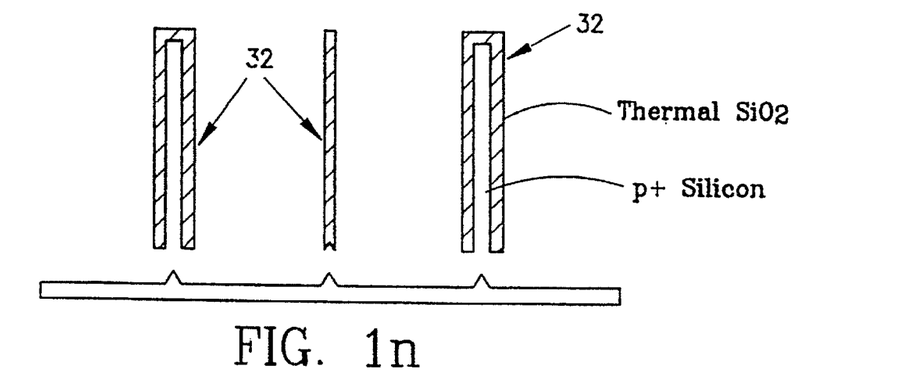

A second trench RIE step forms sidewalls 28 exceeding 100 μm in depth, as desired, FIG. 1k. Then, another thermal silicon dioxide ($O_2/N_2/H_2$ precursors) layer 30 is grown to provide isolation and a top/sidewall etch mask, FIG. 1l. Finally, the floor silicon dioxide is removed by using a low pressure RIE using CF4 plasma, resulting in the structure of FIG. 1m. The entire structure can be released off the wafer by using an isotropic $SF_6$ RIE to undercut the high aspect ratio beams, FIG. 1n. Opening contact windows can be subsequently achieved by another low pressure RIE using $CF_4$ plasma.

Figure 2A:
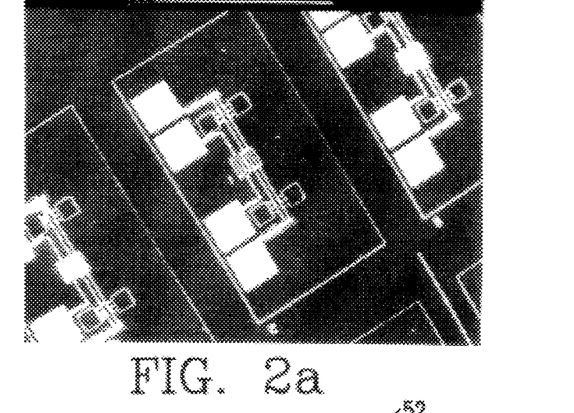
FIGS. 2a–2g illustrate in diagrammatic form various features of an interferometer formed on a chip.
Figure 2B:
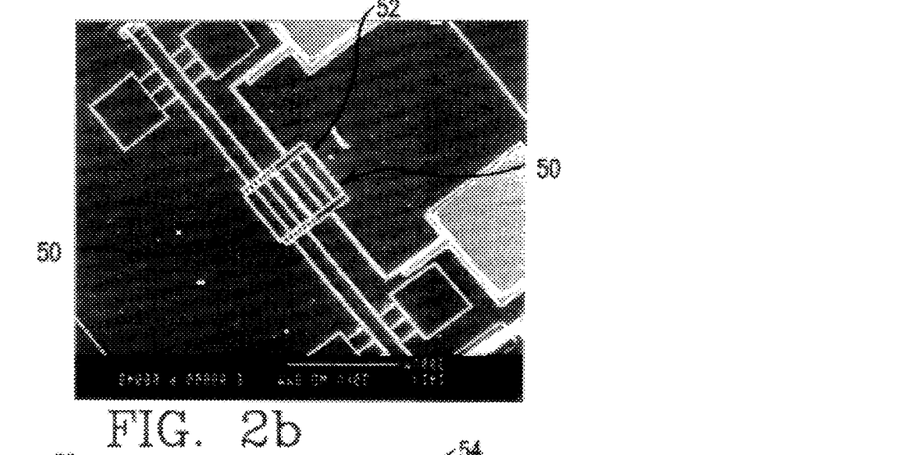
Figure 2C:
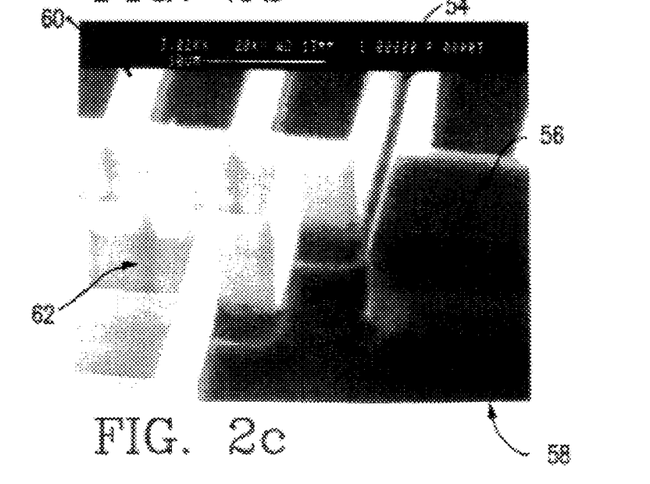
Figure 2D:
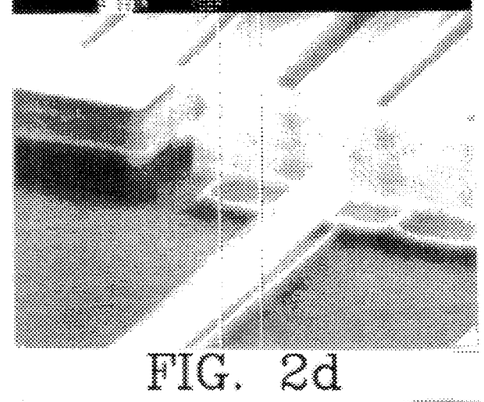
Figure 2E:
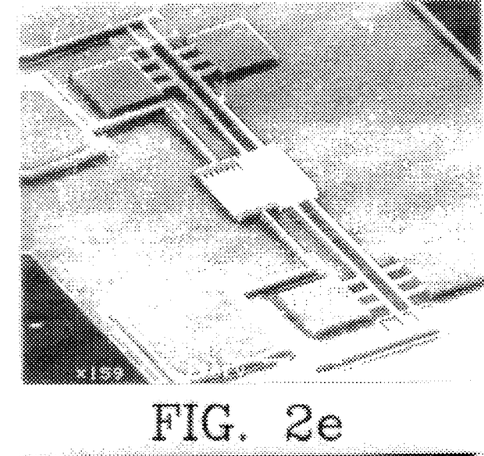
Figure 2F:
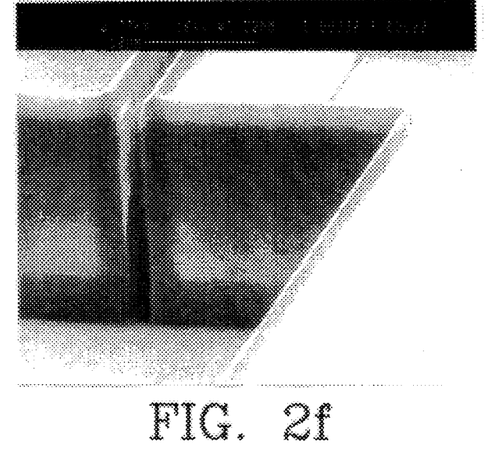
Figure 2G:
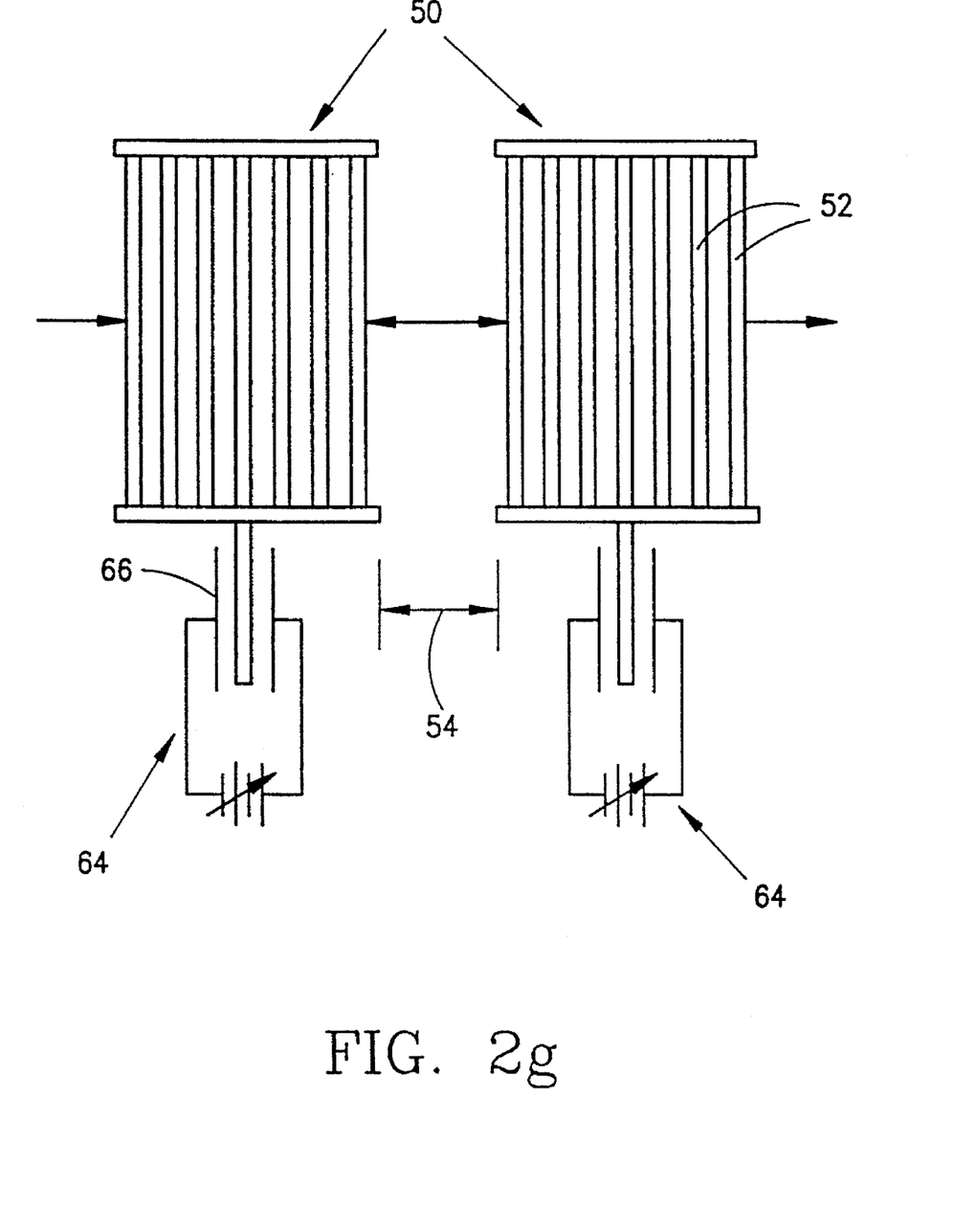

We have shown that the SCREAM process, as disclosed in U.S. Pat. No. 5,198,390, can produce a Fabry-Perot interferometer on a chip. FIG.'S 2a–2g depict what is believed to be the first application of micromechanics concepts to fabricate an out-of-plane single crystal silicon Fabry-Perot interferometer "on-a-chip." Sidewall aspect ratios of 20:1 of vertical depth (20–30 μm) to lateral width (1–2 μm) have been achieved. FIG. 2a depicts a plan view of an FPI-on-a-chip. As better seen in the close-up view depicted in FIG. 2b, the inteferometer consists of two mirror stacks 50 separated by a 2.4 μm gap. Each of the stacks 50 contains individual 20 μm deep vertical mirror elements 52, of which four per stack are shown. FIG. 2c depicts a closer view of the two mirror stacks, side by side separated by a 2.4 μm gap 54. One of the stacks 56 is fixed to the substrate 58, while the other stack 60 is released. The FIG. also depicts a spring geometry 62 which allows motion between the substrate and the released stack. FIG. 2d depicts an additional view of the released mirror stack. The stack on the right moves capacitively with respect to the left fixed mirror stack. FIG. 2e provides an additional view of the interferometer on-a-chip, depicting silicon-on-insulator islands resulting from window opening, oxide isolating segments (12 small mechanical beams) and metallized mesas. FIG. 2f provides a closer view of the the gap between mirror stacks. FIG. 2g graphically depicts the mirror stacks 50, stack gap 54, individual mirror elements 52 and capacitive means 64 to alter the gap spacing. The mirror stacks consist of a series of pairs of high and low index thin film stacks. The mirrors of the device are attracted when a bias voltage of 16 VDC is applied between the control electrodes 66.

Figure 3A:
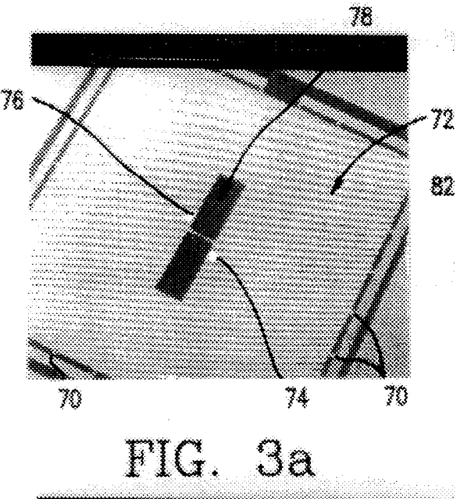
FIGS. 3a–3e illustrate in diagrammatic form various features on an interferometer formed on a frame.
Figure 3B:
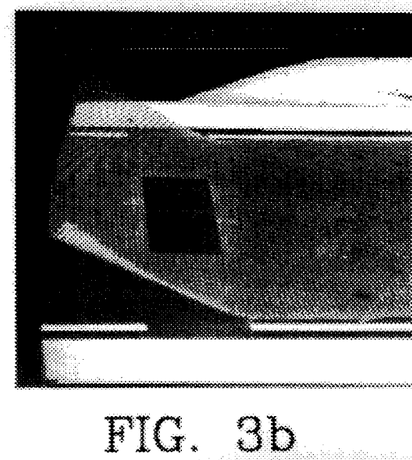

The instant invention includes novel modification of the aforementioned SCREAM process, allowing the fabrication of Fabry-Perot interferometers "on-a-frame" made from freely-released beams of vertical dimensions comparable to a fiber optic diameter. This novel fabrication process produces very high aspect ratio devices having structural heights of over 100 μm. FIGS. 3a–3b depict a FPI-on-a-frame resulting from the instant process, called Scream of High Aspect Ratio Proportions (SHARP).

Figure 3C:
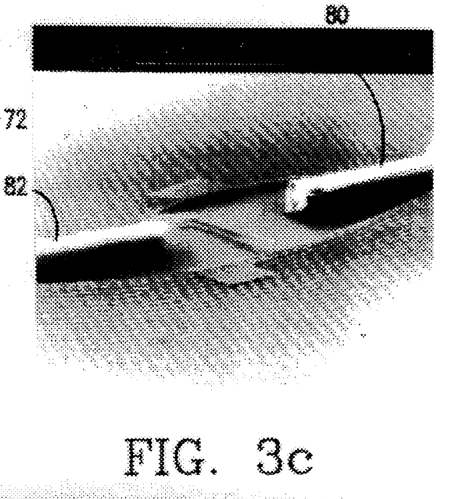
Figure 3D:
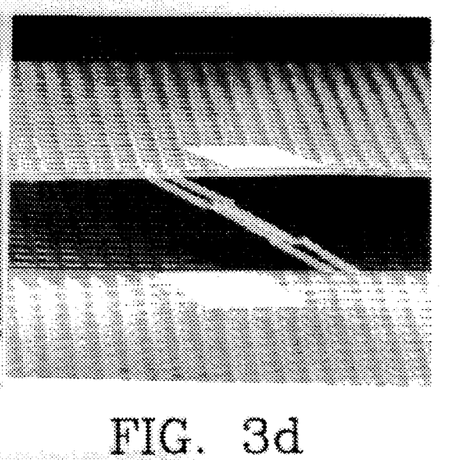
Figure 3E:
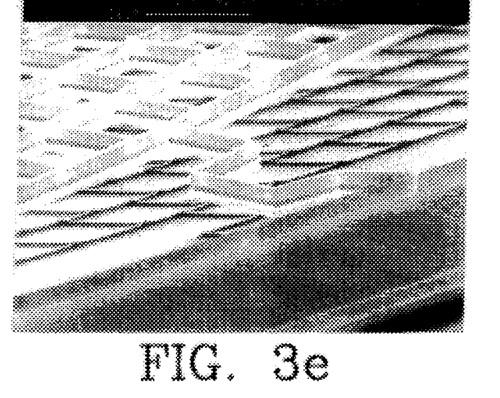

FIG. 3a depicts a top view of a FPI-on-a-frame fabricated using the instant inventive process. Serpentine springs 70 hold released framed device 72 in place, including released pads 74 and 76, and released optical device 78 in the center. FIG. 3b depicts an entirely released frame 72, clearly illustrating the membrane-like nature of the released structure. FIG. 3c, provided for illustrative purposes, depicts two single mode fibers 80, 82 with 125 μm cladding diameter and 9 μm core diameter, with a released optical device 78 placed therebetween. A preferred manner of use, enabling much easier optical alignment between the mirrors and the fibers, would place a device having significant structural height, on the order of the fiber cladding diameter, between two self-aligned fiber optics. FIG. 3d provides an additional look at a released, suspended mirrors. FIG. 3e provides a clearer depiction of one of the serpentine springs 70 which holds a released frame 72 to the substrate. These springs are very easily clipped off by using a testing probe under an optical microscope.

Figure 4A:
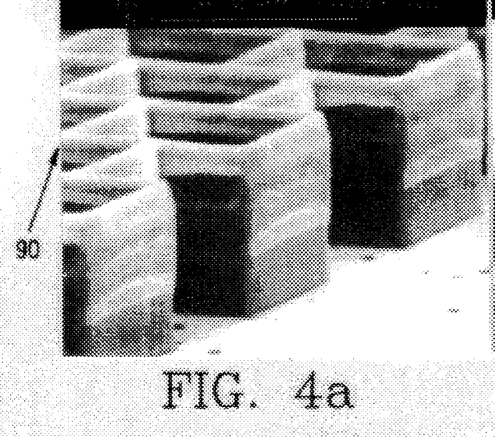
FIGS. 4a–4d illustrate in diagrammatic form various features of a high aspect ratio deep frame interferometer.
Figure 4B:
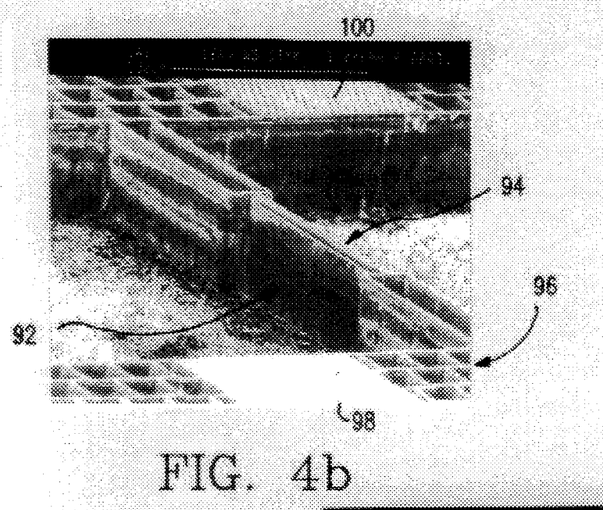
Figure 4C:
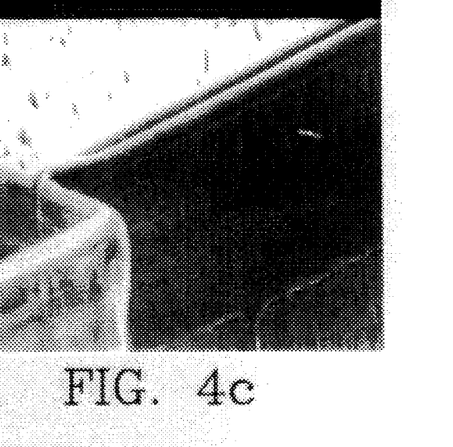
Figure 4D:
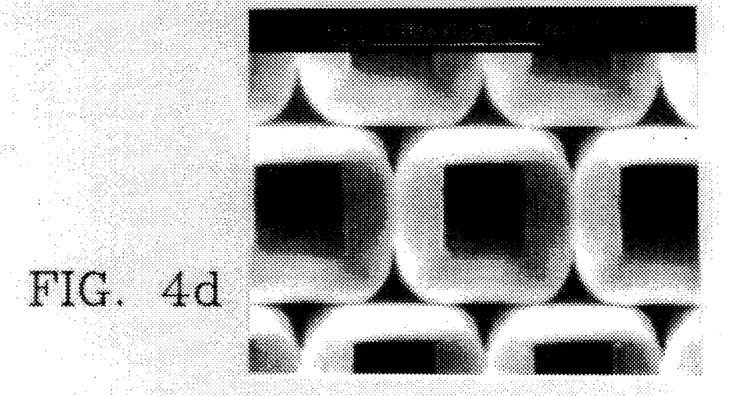

FIGS. 4a–4b depict high aspect ratio elements formed using the instant process. FIG. 4a depicts an intermediate step in the formation of released structures, specifically depicting a device grid 90 with a thick silicon dioxide masking layer. The grid can undergo further etching to increase the wall height. FIG. 4b depicts high aspect ratio mirror plates 92, 94 each connected to a suspended grid frame 96, including suspended contact pads 98, 100. This etch depth realized is unprecedented for conventional dry etching techniques. Striations on the sidewalls are due to interruptions in the RIE etching. It is clear that the sidewalls exhibit very good verticality, since any small deviation would have been exaggerated during the long etch. As was mentioned above, optical alignment is made much easier using deep vertical mirror sidewalls. FIG. 4c provides a closer view of the sidewalls of mirrors 92 and 94, including a gap separating the mirrors, clearly depicting sidewall smoothness. Smoothness is one of the most important parameters in determining the successful operation of the interferometer. FIG. 4d provides a close up view of a small grid pattern, 100 or 98. The openings of the grid should be large enough to allow the etching ions to reach the substrate, but small enough to allow good electrical contact.

Figure 5A:
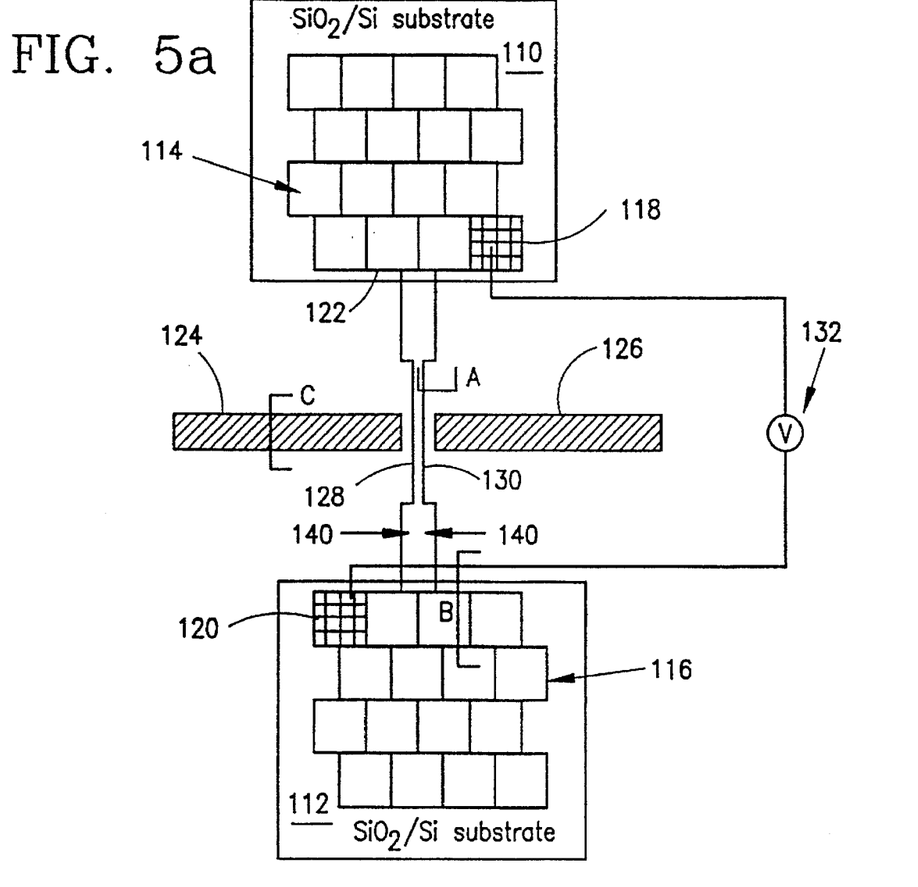
FIGS. 5a–5c illustrate in schematic form various features associated with an FPI on a frame interferometer.
Figures 5B, 5C:
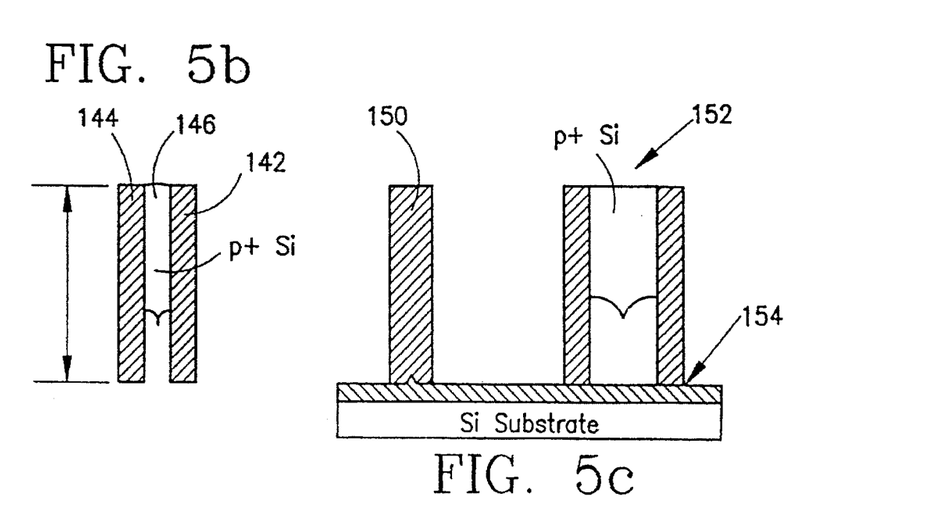

FIGS. 5a–5c provide a schematic view of a testing setup for testing FPI-on-a-frame, including substrates 110 and 112, suspended grid frame structures 114 and 116, suspended contact pads 118 and 120, a representative oxide isolating segment 122, input fiber 124 and output fiber 126, free standing, quarter-wavelength thick silicon dioxide and silicon film stacks (moving mirrors) 128 and 130, and means for applying a test voltage 132. Applying a biasing voltage across the contact pads 118 and 124 results in movement of the mirrors (indicated by arrows 140), resulting in an altering of the gap between the mirrors, and hence altering the transmissive characteristics of the optical device, in the known manner of interferometers. FIG. 5b provides a cross section view A of one of the free standing mirrors, specifically 130. The mirror depicted in FIG. 5b has been formed with oxide surfaces 142 and 144 surrounding a silicon core 146. In this case the mirror structure is IR light transmissive. It should be noted that the device can be made visible light transmissive by oxidizing the beam completely through. FIG. 5c provides a cross section B view of the frame support beam 152 and an oxide isolating segment 150. The isolating segment has been oxidized completely through, while the support beam is formed in manner similar to that of the mirror cross section A. The released frame has been picked up from its original substrate and placed between the fiber optics, resting on chip substrate 116, indicated at 154.

Figure 6:
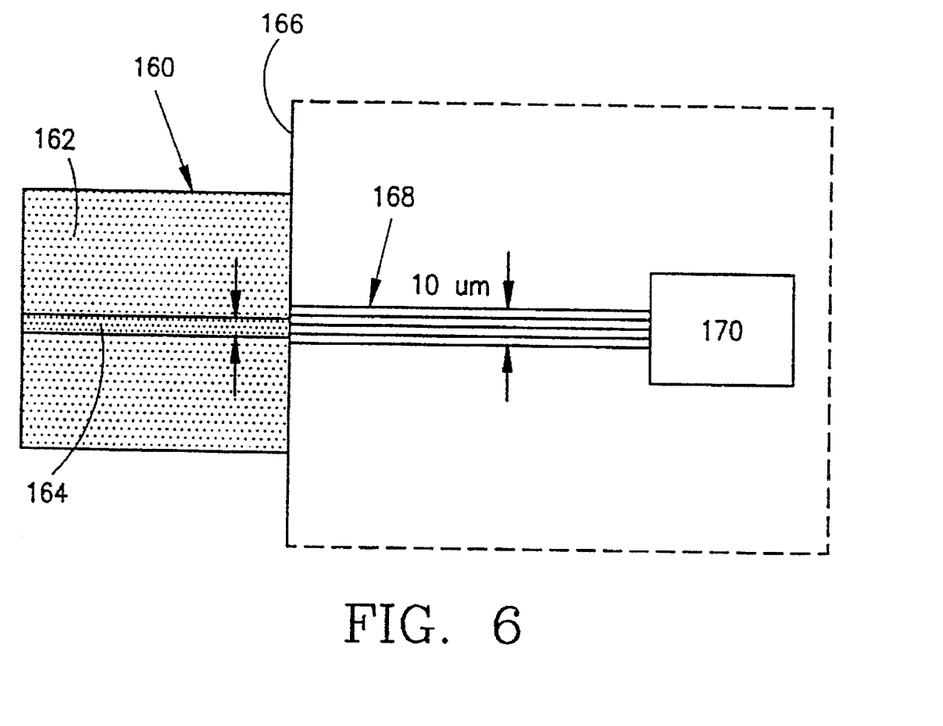
FIG. 6 provides a schematic view of coupling a fiber optic to an FPI on a frame interferometer; and, FIGS. 7a–7b illustrate in diagrammatic form process steps for forming a waveguide.
Figure 7A:
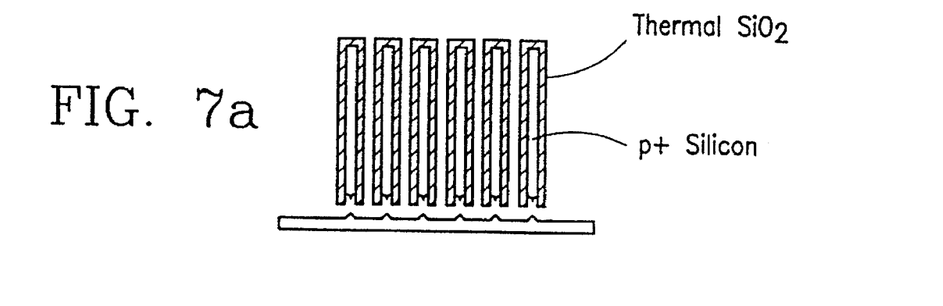
Figure 7B:
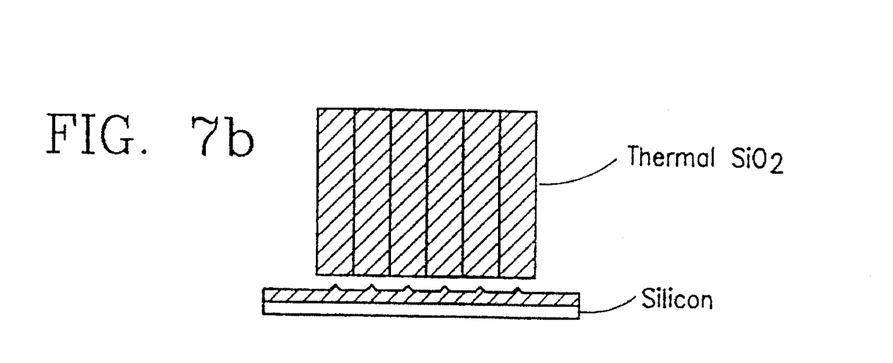

FIG. 6 provides a schematic view of an integration of an interferometer and a fiber. Fiber 160, consisting of cladding 162 and 6–9 μm diameter fiber core 164, contacts a fully oxidized frame periphery 166. Since the frame periphery is fully oxidized, it is visible light transmissive. A 10 μm silicon dioxide waveguide 168 provides connection between fiber core 164 and interferometer 170. FIG. 7 provides a cross section view of the waveguide 168. FIG. 7a depicts the standard silicon dioxide/silicon mirror structure formed as described in the instant process. FIG. 7b depicts the additional step of growing the mirrors together via a thermal silicon dioxide oxidation.

The process described, which can be considered to be an important addition to the SCREAM process, exhibits powerful features such as the possibility of generating very high surface to volume ratio structures. Thus, this accessible new technology can produce very large surface area capacitor actuators and micromechanical structures capable of generating forces in the order of 10 mN (or large pressures of 100–1000 GPa at which phase changes can take place) with displacements of several 10 μm.

The process parameters can be tailored to a wide range of performance requirements and can generate three-dimensional releasable objects of arbitrary shape. Although this process uses a single mask, additional lithography steps can produce more complex geometries with an increasing number of applications, such as variably formed stepped structures or beam structures with vastly different stiffnesses in different directions reducing their number of degrees of freedom (e.g. $k_x$, $k_y$=infinite, $k_z$=0.1 N/m).

Using the wafer-free, physically movable and fixable frame idea, an important mask technology can develop to create a wide spectrum of applications such as collimating X-rays, masks, very high aspect ratio microcapillaries, microchannel plates for channel-electron-multipliers, and fluid channels. Such a releasable frame structure can also be conceived as a minuscule breadboard with applications such as smart connectors (direct-chip attach), optical (fiber-chip) coupling elements or microlens fixtures, detachable flexible micro-connections (such as manifold microplugs).

It will be apparent to those of skill in the art that variations may be made in the foregoing process without departing from the true spirit, scope and applications of the invention.

What is claimed is:

1. A masking process for the fabrication of submicron, single-crystal released structures, comprising:

oxidizing an exposed top surface of a wafer from which a single-crystal structure is to be fabricated;

forming a first mask on said wafer by depositing a mask material on said oxidized top surface of said wafer, forming a pattern in resist on said mask material to define said structure to be formed in said wafer and transferring said pattern to said mask material;

forming an intermediate structure in said wafer by transferring said pattern into said wafer by etching into said wafer to a first depth, oxidizing exposed wafer surfaces and then etching to remove oxidized surfaces;

transforming said intermediate structure into a second mask by oxidizing exposed wafer surfaces, and then removing said oxidation from a top surface of said wafer;

forming said single crystal structure by transferring said pattern into said wafer by etching into said wafer to a second depth deeper than said first depth, oxidizing exposed wafer surfaces and then removing said oxidation from a top surface of said wafer; and, releasing said single crystal structure from said wafer using an etching process to completely undercut said single crystal structure.

2. A masking process for the fabrication of submicron, single-crystal released structures, comprising:

oxidizing an exposed top surface of a wafer from which a single-crystal structure is to be fabricated;

forming a first mask having a desired pattern on said wafer;

forming an intermediate structure in said wafer by transferring said pattern into said wafer;

transforming said intermediate structure into a second mask defined by said pattern;

forming said single crystal structure by transferring said pattern into said wafer; and, releasing said single crystal structure from said wafer.

3. The masking process of claim 2 wherein forming a first mask comprises the steps of depositing a mask material on said oxidized top surface of said wafer, forming said desired pattern in resist on said mask material to define said structure to be formed in said wafer and transferring said pattern to said mask material.

4. The masking process of claim 2 wherein forming an intermediate structure in said wafer comprises the steps of etching exposed wafer surfaces, oxidizing newly exposed wafer surfaces and then etching to remove oxidized surfaces.

5. The masking process of claim 2 wherein transforming said intermediate structure into a second mask comprises the steps of oxidizing exposed wafer surfaces, and then removing said oxidation from a top surface of said wafer.

6. The masking process of claim 2 wherein forming said single crystal structure by transferring said pattern into said wafer comprises the steps of etching exposed wafer surfaces, oxidizing newly exposed wafer surfaces and then removing said oxidation from a top surface of said wafer.

7. The masking process of claim 2 wherein releasing said single crystal structure comprises an etching process to completely undercut said single crystal structure.

8. The masking process of claim 2, further including, after releasing said single crystal structure from said wafer, opening contact windows to said structure by etching.

9. A masking process for the fabrication of submicron, single-crystal released structures, comprising:

ion implanting a wafer;

annealing said wafer in a high temperature furnace;

oxidizing a top surface of said wafer with thermal silicon dioxide;

depositing a LPCVD silicon dioxide mask material on said oxidized top surface;

photolithographically forming a pattern in resist on said mask material;

transferring said pattern to said mask material by ion etching;

transferring said pattern into said wafer by ion etching into said wafer;

oxidizing exposed wafer surfaces with thermal silicon dioxide;

etching said oxidized surfaces leaving formed, patterned intermediate structures in said wafer;

oxidizing exposed surfaces of said wafer with thermal silicon dioxide, including completely oxidizing said intermediate structures;

removing said oxidized surface from said top of said wafer by ion etching, resulting in a second mask formed from said oxidized intermediate structures;

transferring said pattern into said wafer by etching into said wafer;

oxidizing exposed wafer surfaces with thermal silicon dioxide;

removing said oxidized wafer surface from said top surface of said wafer; and, releasing said single crystal structure from said wafer using ion etching to completely undercut said single crystal structure.

10. A process for the fabrication of submicron, ultra-high aspect ratio structures, comprising the steps of:

oxidizing an exposed top surface of a wafer;

forming a first mask having a desired pattern on said wafer;

forming an intermediate structure in said wafer by transferring said pattern into said wafer; and, transforming said intermediate structure into a second mask defined by said pattern.

11. The process of claim 10 including the additional step of forming a submicron, ultra-high aspect ratio structure by transferring said pattern defined by said second mask into said wafer.

12. The process of claim 11 including the additional step of releasing said submicron, ultra-high aspect ratio structure from said wafer.

13. The masking process of claim 10 wherein forming a first mask comprises the steps of depositing a mask material on said oxidized top surface of said wafer, forming said desired pattern in resist on said mask material to define said structure to be formed in said wafer and transferring said pattern to said mask material.

14. The masking process of claim 10 wherein forming an intermediate structure in said wafer comprises the steps of etching exposed wafer surfaces, oxidizing newly exposed wafer surfaces and then etching to remove oxidized surfaces.

15. The masking process of claim 10 wherein transforming said intermediate structure into a second mask comprises the steps of oxidizing exposed wafer surfaces, and then removing said oxidation from a top surface of said wafer.

16. The masking process of claim 11 wherein forming said submicron, ultra-high aspect ratio structure by transferring said pattern into said wafer comprises the steps of etching exposed wafer surfaces, oxidizing newly exposed wafer surfaces and then removing said oxidation from a top surface of said wafer.

17. The masking process of claim 12 wherein releasing said high-aspect ratio structure comprises an etching process to completely undercut said structure.

* * * * *